(12) United States Patent
Han et al.

(10) Patent No.: US 11,217,162 B2
(45) Date of Patent: Jan. 4, 2022

(54) PIXEL DRIVING CIRCUIT, PIXEL CIRCUIT, DISPLAY PANEL AND DISPLAY APPARATUS

(71) Applicant: BOE TECHNOLOGY GROUP CO., LTD., Beijing (CN)

(72) Inventors: Long Han, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/762,043

(22) PCT Filed: Dec. 5, 2019

(86) PCT No.: PCT/CN2019/123305
§ 371 (c)(1),
(2) Date: May 6, 2020

(87) PCT Pub. No.: WO2020/155844
PCT Pub. Date: Aug. 6, 2020

(65) Prior Publication Data
US 2020/0342808 A1    Oct. 29, 2020

(30) Foreign Application Priority Data

Feb. 2, 2019 (CN) .......................... 201910107162.8

(51) Int. Cl.
*G09G 3/3233* (2016.01)
*G11C 19/28* (2006.01)

(52) U.S. Cl.
CPC ... *G09G 3/3233* (2013.01); *G09G 2300/0809* (2013.01); *G09G 2310/0286* (2013.01); *G09G 2330/021* (2013.01); *G11C 19/28* (2013.01)

(58) Field of Classification Search
None
See application file for complete search history.

(56) References Cited

U.S. PATENT DOCUMENTS

| | | | |
|---|---|---|---|
| 6,229,506 B1 * | 5/2001 | Dawson | G09G 3/3233 345/82 |
| 9,449,994 B2 | 9/2016 | Kwon et al. | |
| 9,490,276 B2 | 11/2016 | Kim et al. | |
| 9,818,765 B2 | 11/2017 | Osawa et al. | |

(Continued)

FOREIGN PATENT DOCUMENTS

| AU | 2019259412 A1 | 12/2019 |
|---|---|---|
| CN | 103456739 A | 12/2013 |

(Continued)

OTHER PUBLICATIONS

Office Action dated Jan. 3, 2020, issued in counterpart CN Application No. 201910107162.8, with English Translation. (24 pages).

*Primary Examiner* — Dorothy Harris
(74) *Attorney, Agent, or Firm* — Westerman, Hattori, Daniels & Adrian, LLP (57) ABSTRACT

The present disclosure discloses a pixel driving circuit, a pixel circuit, a display panel and a display apparatus, wherein the pixel driving circuit is used for driving a light-emitting element to emit light, and includes: a plurality of switching transistors, wherein each of the switching transistors is an oxide thin film transistor.

12 Claims, 6 Drawing Sheets

(56) References Cited

U.S. PATENT DOCUMENTS

| | | |
|---|---|---|
| 10,529,277 B2 | 1/2020 | Lee et al. |
| 2015/0243220 A1* | 8/2015 | Kim .................... H01L 27/1225 |
| | | 345/215 |
| 2015/0294996 A1 | 10/2015 | Li et al. |
| 2016/0293090 A1* | 10/2016 | Long ........................ G09G 3/20 |
| 2016/0322116 A1* | 11/2016 | Jang ..................... G09G 3/2092 |
| 2018/0005572 A1 | 1/2018 | Ka et al. |
| 2018/0144811 A1* | 5/2018 | Han ....................... G09G 3/296 |
| 2020/0294461 A1* | 9/2020 | Xu ........................... G09G 3/20 |
| 2020/0342808 A1 | 10/2020 | Han et al. |
| 2021/0020090 A1* | 1/2021 | Shang ................... G11C 19/28 |

FOREIGN PATENT DOCUMENTS

| | | |
|---|---|---|
| CN | 104318888 A | 1/2015 |
| CN | 105408813 A | 3/2016 |
| CN | 105612620 A | 5/2016 |
| CN | 105895022 A | 8/2016 |
| CN | 105957556 A | 9/2016 |
| CN | 106952618 A | 7/2017 |
| CN | 107004682 A | 8/2017 |
| CN | 107078135 A | 8/2017 |
| CN | 107564467 A | 1/2018 |
| CN | 208141796 U | 11/2018 |
| CN | 108986744 A | 12/2018 |
| CN | 109036273 A | 12/2018 |
| CN | 109584799 A | 4/2019 |
| EP | 3113226 B1 | 5/2019 |
| KR | 10-2015-0078714 A | 7/2015 |
| WO | 2016/108664 A1 | 7/2016 |
| WO | WO-2019205745 A1 * | 10/2019 ............... G09G 3/20 |

* cited by examiner

PIXEL DRIVING CIRCUIT, PIXEL CIRCUIT, DISPLAY PANEL AND DISPLAY APPARATUS

CROSS-REFERENCE TO RELATED APPLICATION(S)

This application is a U.S. national phase application of the PCT application No. PCT/CN2019/123305, entitled "PIXEL DRIVING CIRCUIT, PIXEL CIRCUIT, DISPLAY PANEL AND DISPLAY APPARATUS", filed on Dec. 5, 2019, which claims priority to the Chinese Patent Application No. 201910107162.8, entitled "PIXEL DRIVING CIRCUIT, PIXEL CIRCUIT, DISPLAY PANEL AND DISPLAY APPARATUS", filed on Feb. 2, 2019, which are incorporated herein by reference in their entireties.

TECHNICAL FIELD

The present disclosure relates to the field of display technology, and more particularly, to a pixel driving circuit, a pixel circuit, a display panel, and a display apparatus.

BACKGROUND

Organic Light-Emitting Diodes (OLEDs for short) are one of hotspots in the current research field of flat panel displays, have advantages such as low energy consumption, low production cost, self-illumination, wide viewing angle and high response speed etc., and have been widely applied in display fields such as mobile phones, tablet computers, digital cameras etc.

An OLED display panel comprises a pixel driving circuit and a Gate Driver on Array (GOA for short) circuit. The GOA circuit is used to provide a scanning signal to the pixel driving circuit, and the pixel driving circuit is used to drive an OLED in the OLED display panel to emit light, so as to achieve display. According to the inventors' research, it is found that in the related art, some of switches in the pixel driving circuit have leakage current, which results in large power consumption of the pixel driving circuit.

SUMMARY

In order to solve the above technical problems, the embodiments of the present disclosure provide a pixel driving circuit, a pixel circuit, a display panel and a display apparatus, which may reduce the leakage current in the pixel driving circuit and reduce the power consumption of the pixel driving circuit.

In a first aspect, the present disclosure provides a pixel driving circuit for driving a light-emitting element to emit light, comprising:
a plurality of switching transistors,
wherein each of the switching transistors is an oxide thin fila transistor.

In some embodiments, the pixel driving circuit further comprises: a driving transistor,
wherein the driving transistor is a low temperature polysilicon thin film transistor.

In some embodiments, all the switching transistors are of the same type.

In a some aspect, the embodiments of the present disclosure further provide a pixel circuit, comprising: a shift register and the pixel driving circuit described above,
wherein the shift register comprises a plurality of transistors, wherein each of the transistors is a low temperature polysilicon thin film transistor.

In some embodiments, all the transistors are of the same type.

In some embodiments, when the transistors have the same type as that of the switching transistors, the shift register is used to provide a first driving signal, and the pixel driving circuit is used to control the light-emitting element according to the first driving signal.

In some embodiments, when the transistors have a type opposite to that of the switching transistors, the pixel circuit further comprises an inverter,
wherein the inverter is coupled to the shift register and the pixel driving circuit respectively, the shift register is used to provide a first driving signal, the inverter is used to invert the first driving signal to generate a second driving signal, and the pixel driving circuit is used to control the light-emitting element according to the second driving signal.

In some embodiments, transistors in the inverter have the same type as that of the transistors in the shift register.

In a third aspect, the embodiments of the present disclosure further provide a display panel, comprising: the pixel circuit described above.

In a fourth aspect, the embodiments of the present disclosure further provide a display apparatus comprising the display panel described above.

The embodiments of the present disclosure provide a pixel driving circuit, a pixel circuit, a display panel, and a display apparatus, wherein the pixel driving circuit is used for driving a light-emitting element to emit light, and includes: a plurality of switching transistors, wherein each of the switching transistors is an oxide thin film transistor. The switching transistors used for realizing switching in the pixel driving circuit according to the embodiments of the present disclosure are oxide thin film transistors. Since the oxide thin film transistors have advantages such as low leakage current, not only the leakage current in the pixel driving circuit is reduced, but also the power consumption of the pixel driving circuit during display is decreased.

Other features and advantages of the present disclosure will be set forth in the following description, and partly become obvious from the description, or be understood by implementing the present disclosure. The purposes and other advantages of the present disclosure may be realized and obtained through structures particularly pointed out in the description, claims, and accompanying drawings.

BRIEF DESCRIPTION OF THE ACCOMPANYING DRAWINGS

The accompanying drawings are used to provide a further understanding of the technical solutions according to the present disclosure, and constitute a part of the description. The accompanying drawings are used to explain the technical solutions according to the present disclosure together with the embodiments of the present application, and do not constitute limitations on the technical solutions according to the present disclosure.

DETAILED DESCRIPTION

In order to make the purposes, technical solutions and advantages of the present disclosure more obvious and clear, the embodiments of the present disclosure will be described in detail below with reference to the accompanying drawings. It should be illustrated that, the embodiments in the present application and the features in the embodiments may be arbitrarily combined with each other without conflict.

Steps shown in flowcharts of the accompanying drawings may be performed in a computer system such as a group of computer-executable instructions. Further, although a logical order is shown in the flowcharts, in some cases, the steps shown or described may be performed in an order different from that here.

Unless otherwise defined, the technical terms or scientific terms disclosed in the embodiments of the present disclosure shall have the ordinary meanings understood by those of ordinary skill in the art to which the present disclosure belongs. The terms "first", "second", etc. used in the embodiments of the present disclosure do not indicate any order, quantity, or importance, but are only used to distinguish different components. Words such as "comprising" or "including" mean that an element or item appearing before the word encompasses elements or items appearing after the word and its equivalents without excluding other elements or items. Words such as "connected to" or "connected with" are not limited to physical or mechanical connections, but may comprise electrical connections, regardless of direct connection or indirect connection.

It may be understood by those skilled in the art that as a source and a drain of each of transistors, switching transistors and driving transistors are symmetrical, the source and the drain are interchangeable. In the embodiments of the present disclosure, in order to distinguish two electrodes of each of the transistors, the switching transistors and the driving transistors other than a gate, one of the electrodes is referred to as a first electrode, and the other of the electrodes is referred to as a second electrode. The first electrode may be a source or a drain, and the second electrode may be a drain or a source. Further, the gate may also be referred to as a control electrode.

Figure 1:
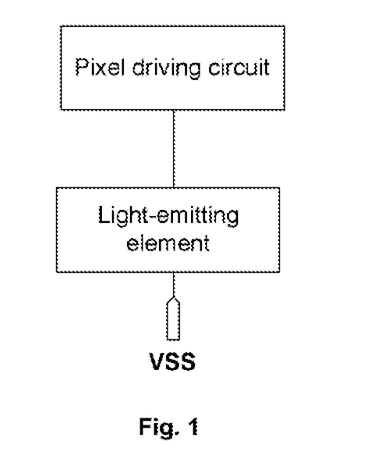
FIG. 1 is a schematic diagram of connection of a pixel driving circuit according to an embodiment of the present disclosure.

FIG. 1 is a schematic diagram of connection of a pixel driving circuit according to an embodiment of the present disclosure. As shown in FIG. 1, the embodiment of the present disclosure provides a pixel driving circuit for driving a light-emitting element to emit light, comprising: a plurality of switching transistors, wherein each of the switching transistors may be an oxide thin film transistor.

In some embodiments, the light-emitting element may be an OLED having an anode coupled to the pixel driving circuit, and a cathode coupled to a low-level power supply terminal VSS. Here, the pixel driving circuit is used to provide driving current to the light-emitting element, and the low-level power supply terminal VSS continuously provides a low-level signal.

Specifically, the oxide thin film transistor comprises a gate electrode, a source electrode, a drain electrode, and an active layer, wherein the active layer of the oxide thin film transistor is an oxide layer, and oxide in the oxide layer is an oxide semiconductor material such as Indium Gallium Zinc Oxide (IGZO for short) or Indium Tin Zinc Oxide (ITZO for short), and will not be described in detail here. It should be illustrated that the oxide layer is manufactured using a Low Temperature Poly-Oxide (LTPO for short) process. The oxide thin film transistor has advantages such as high carrier mobility, low leakage current and good uniformity etc., and may realize low-frequency driving and low power consumption.

In some embodiments, the oxide thin film transistor has a bottom gate structure, and the oxide thin film transistor is an N-type transistor.

The pixel driving circuit according to the embodiment of the present disclosure is used to drive the light-emitting element to emit light, and comprises: a plurality of switching transistors, wherein each of the switching transistors is an oxide thin film transistor. The switching transistors used for realizing switching in the pixel driving circuit according to the embodiment of the present disclosure are oxide thin film transistors. Since the oxide thin film transistors have advantages such as low leakage current, not only the leakage current in the pixel driving circuit is reduced, but also the power consumption of the pixel driving circuit during display is decreased.

In some embodiments, in order to simplify the process of manufacturing the pixel driving circuit, the switching transistors in the pixel driving circuit are of the same type.

Specifically, the pixel driving circuit further comprises a driving transistor. The driving transistor in the embodiment of the present disclosure is a low-temperature polysilicon thin film transistor, instead of an oxide thin film transistor for two reasons. On the one hand, the low-temperature polysilicon thin film transistor has a strong driving capability, which may maintain a driving capability of the pixel driving circuit; and on the other hand, the driving transistor has a relatively large channel, and if the driving transistor is an oxide thin film transistor, it may result in a large area occupied by the driving transistor.

Further, the low-temperature polysilicon thin film transistor and the oxide thin film transistors included in the pixel driving circuit according to the embodiment of the present disclosure may incorporate the advantages of the low-temperature polysilicon thin film transistor and the advantages of the oxide thin film transistors, so that the pixel driving circuit has a better performance.

It should be illustrated that the active layer of the low-temperature polysilicon thin film transistor comprises polysilicon.

In some embodiments, the driving transistor may be a P-type transistor or an N-type transistor, which is not limited in the embodiment of the present disclosure, and may be determined according to specific practical requirements.

Figure 2:
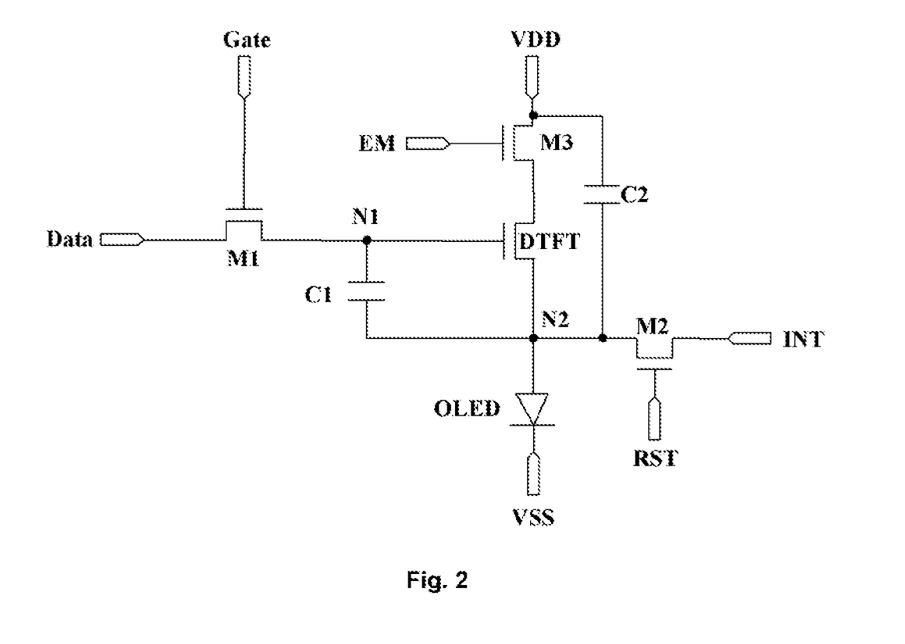
FIG. 2 is an equivalent circuit diagram of a pixel driving circuit according to an embodiment of the present disclosure.

FIG. 2 is an equivalent circuit diagram of a pixel driving circuit according to an embodiment of the present disclosure. As shown in FIG. 2, the pixel driving circuit comprises a first switching transistor M1, a second switching transistor M2, a third switching transistor M3, a first capacitor C1, a second capacitor C2 and a driving transistor DTFT. Here, the pixel driving circuit may have a variety of circuit structures. FIG. 2 is illustrated by taking one of the variety of circuit structures as an example. The structure of the pixel driving circuit is not specifically limited in the embodiment of the present disclosure, as long as the pixel driving circuit may drive a light-emitting element to emit light.

In the present embodiment, the first switching transistor M1, the second switching transistor M2, and the third switching transistor M3 are all oxide thin film transistors.

As shown in FIG. 2, the first switching transistor M1 has a control electrode coupled to a scanning signal terminal Gate, a first electrode coupled to a data signal terminal Data, and a second electrode coupled to a first node N1; the second switching transistor M2 has a control electrode coupled to a reset signal terminal RST, a first electrode coupled to a signal input terminal INT, and a second electrode coupled to a second node N2; the first capacitor C1 has one terminal coupled to the first node N1, and the other terminal coupled to the second node N2; the third switching transistor M3 has a control electrode coupled to a light-emitting control terminal EM, a first electrode coupled to a high-level power supply terminal VDD, and a second electrode coupled to a first electrode of the driving transistor DTFT; the driving transistor DTFT has a control electrode coupled to the first node N1, and a second electrode coupled to the second node N2; and the second capacitor C2 has one terminal coupled to the high-level power supply terminal VDD, and the other terminal coupled to the second node N2.

Here, the high-level power supply terminal VDD continuously provides a high-level signal.

The technical solutions according to the embodiments of the present disclosure will be further described below through an operating process of the pixel driving circuit.

Figure 3:
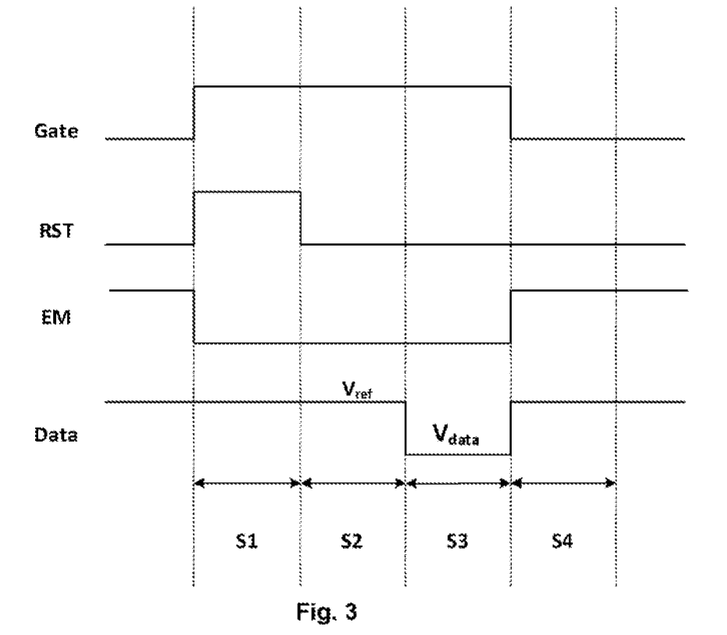
FIG. 3 is an operating timing diagram of a pixel driving circuit according to an embodiment of the present disclosure.

By taking all the switching transistors and the driving transistor being N-type transistors as an example, FIG. 3 is an operating timing diagram of a pixel driving circuit according to an embodiment of the present disclosure. As shown in FIGS. 2 and 3, the pixel driving circuit according to the embodiment of the present disclosure comprises three switching transistors (M1 to M3), one driving transistor (DTFT), two capacitor units (C1 and C2), and seven input terminals (Data, Gate, INT, VDD, VSS, EM and RST), and an operating process of the pixel driving circuit comprises the following phases.

In a first phase S1 which is a preset phase, an input signal at the scanning signal terminal Gate is at a high level, the first switching transistor M1 is turned on, and a signal at the data signal terminal Data is provided to the first node N1. At this time, a voltage value $V_1$ at the first node N1 is equal to $V_{ref}$, an input signal at the reset, signal terminal RST is at a high level, the second switching transistor. M2 is turned on, and a signal at the signal input terminal INT is provided to the second node N2. At this time, a voltage value $V_2$ at the second node N2 is equal to $V_{int}$. Then, the first capacitor C1 maintains a voltage difference between the first node N1 and the second node N2. At this time, the driving transistor DTFT is turned on. Since an input signal at the light-emitting control terminal EM is at a low level, the third switching transistor M3 is turned off, and therefore the light-emitting element OLED does not emit light.

In a second phase S2 which is a compensation phase, the input signal at the scanning signal terminal Gate is still at a high level, the first switching transistor M1 is turned on, and the driving transistor DTFT is also turned on. The input signal at the reset signal terminal RST is at a low level, and therefore the second switching transistor M2 is turned off. Thus, the first capacitor C1 charges the second node N2 until the voltage value $V_2$ at the second node N2 is equal to $V_{ref}-V_{th}$. At this time, the driving transistor DTFT is turned off, and therefore the light-emitting element OLED still does not emit light.

In a third phase S3 which is a writing phase, the input signal at the scanning signal terminal Gate is still at a high level, and the first switching transistor M1 is turned on. At this time, the voltage value at the data signal terminal Data jumps from $V_{ref}$ to $V_{data}$, so that the voltage value $V_1$ at the first node N1 jumps to $V_{data}$. The voltage value $V_2$ at the second node N2 jumps to $V_{ref}-V_{th}+(V_{data}-V_{ref})*a$ under the bootstrap effect of the first capacitor C1, wherein $a=C_1/(C_1+C_2)$, $C_1$ is a capacitance value of the first capacitor C1, and $C_2$ is a capacitance value of the second capacitor C2.

In a fourth phase S4 which is a light-emitting phase, the input signal at the scanning signal terminal Gate is at a low level, and therefore the first switching transistor M1 is turned off. Thus, the voltage at the first node N1 remains unchanged under the maintenance of the first capacitor C1. The input signal at the light-emitting control terminal EM is at a high level, the third switching transistor M3 is turned on, the driving transistor DTFT is turned on, and the driving transistor DTFT transmits driving current for driving the organic light-emitting diode OLED to the second node N2 under control of the voltage value at the first node N1.

According to a formula of obtaining the current of the driving transistor. DTFT when the driving transistor DTFT is saturated, it may be determined that driving current $I_{OLED}$ through the light-emitting element OLED satisfies:

$$I_{OLED} = K(V_{GS} - V_{th})^2$$
$$= K(V_1 - V_2 - V_{th})^2$$
$$= K(V_{data} - (V_{ref} - V_{th} + (V_{data} - V_{ref})*a)) - V_{th})^2$$
$$= K((1-a)*(V_{data} - V_{ref}))^2$$

wherein K is a fixed constant related to process parameters and geometric dimensions of the driving transistor DTFT, $V_{GS}$ is a gate-source voltage difference of the driving transistor DFTF, and $V_{th}$ is a threshold voltage of the driving transistor DFTF.

It may be seen from a derivation result of the above current formula that in the light-emitting phase, the driving current output by the driving transistor DTFT is not affected by the threshold voltage $V_{th}$ of the driving transistor DTFT, and is only related to the signal at the data signal terminal, which eliminates the influence of the threshold voltage of the driving transistor DTFT on the driving current, and avoids the uneven brightness caused by the difference in threshold voltages $V_{th}$ of driving transistors in pixel driving circuits coupled to different pixels, thereby ensuring the uniform display brightness of the display apparatus and improving the display effect of the entire display apparatus.

Figure 4:
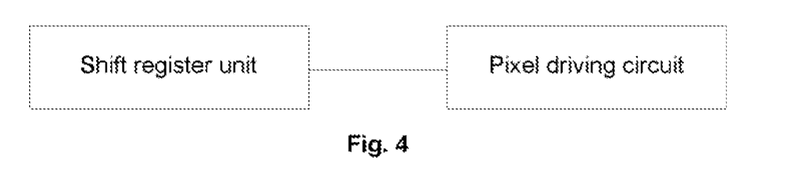
FIG. 4 is a schematic structural diagram of a pixel circuit according to an embodiment of the present disclosure.

The embodiments of the present disclosure further provide a pixel circuit. FIG. 4 is a schematic structural diagram of a pixel circuit according to an embodiment of the present disclosure. As shown in FIG. 4, the pixel circuit according to the embodiment of the present disclosure comprises a shift register and the pixel driving circuit according to the embodiment shown in FIG. 2.

Specifically, the shift register comprises a plurality of transistors, wherein each of the transistors is a low-temperature polysilicon thin film transistor.

Here, the pixel circuit according to the embodiment of the present disclosure comprises the pixel driving circuit according to the embodiment shown in FIG. 2, and has implementation principles and implementation effects which are similar to those of the pixel driving circuit according to the embodiment shown in FIG. 2, which will not be repeated here.

In the present embodiment, the shift register is provided in a non-display region of a display panel. In order to realize a narrow border of the display panel, transistors in the shift register in the embodiment of the present disclosure are all low-temperature polysilicon thin film transistors. In addition, the low-temperature polysilicon thin film transistors further have a good electrical performance and stability and may be beneficial to performing driving in a surrounding region.

In some embodiments, in order to simplify a process of manufacturing the shift register, all the transistors are of the same type, and all the transistors are N-type transistors or P-type transistors.

As an implementation, when the transistors in the shift register have the same type as that of the switching transistors in the pixel driving circuit, that is, the transistors in the shift register are all N-type transistors, the shift register is used to provide a first driving signal, and the pixel driving circuit is used to control a light-emitting element according to the first driving signal.

Specifically, the shift register comprises a signal output terminal. In the implementation, the signal output terminal of the shift register and a scanning signal terminal of the pixel driving circuit are the same signal terminal.

Figure 5:
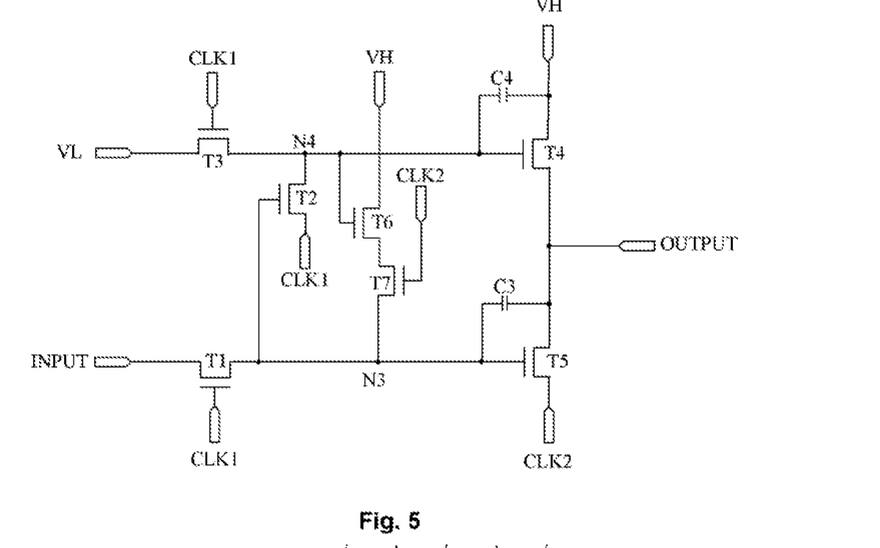
FIG. 5 is an equivalent circuit diagram of a shift register according to an embodiment of the present disclosure.

By taking all of the transistors in the shift register and the switching transistors in the pixel driving circuit being N-type transistors as an example, FIG. 5 is an equivalent circuit diagram of a shift register according to an embodiment of the present disclosure. As shown in FIG. 5, the shift register comprises a first transistor T1, a second transistor T2, a third transistor T3, a fourth transistor T4, a fifth transistor T5, a sixth transistor T6, a seventh transistor T7, a third capacitor C3, and a fourth capacitor C4.

Specifically, the first transistor T1 has a control electrode coupled to a first clock signal terminal CLK1, a first electrode coupled to a signal input terminal INPUT, and a second electrode coupled to a third node N3; the second transistor T2 has a control electrode coupled to the third node N3, a first electrode coupled to the first clock signal terminal CLK1, and a second electrode coupled to a fourth node N4; the third transistor T3 has a control electrode coupled to the first clock signal terminal CLK1, a first electrode coupled to a second power supply terminal VL, and a second electrode coupled to the fourth node N4; the fourth transistor T4 has a control electrode coupled to the fourth node N4, a first electrode coupled to a first power supply terminal VH, and a second electrode coupled to a signal output terminal OUTPUT; the fifth transistor T5 has a control electrode coupled to the third node N3, a first electrode coupled to the signal output terminal OUTPUT, and a second electrode coupled to a second clock signal terminal CLK2; the sixth transistor T6 has a control electrode coupled to the fourth node N4, a first electrode coupled to the first power supply terminal VH, and a second electrode coupled to a first electrode of the seventh transistor T7; the seventh transistor T7 has a control electrode coupled to the second clock signal terminal CLK2, and a second electrode coupled to the third node N3; the third capacitor C3 has one terminal coupled to the third node N3, and the other terminal coupled to the signal output terminal OUTPUT; and the fourth capacitor C4 has one terminal coupled to the fourth node N4, and the other terminal coupled to the first power supply terminal VH.

Here, the first power supply terminal VH continuously provides a high-level signal, the second power supply terminal VL continuously provides a low-level signal, and the input signals at the first clock signal terminal CLK1 and the second clock signal terminal CLK2 are mutually inverted signals.

It should be illustrated that FIG. 5 is illustrated by taking one type of shift register as an example, and the shift register according to the embodiment of the present disclosure may also be various other shift registers, which is not limited in the embodiment of the present disclosure.

The technical solutions according to the embodiments of the present disclosure will be further described below through an operating process of the shift register.

Figure 6:
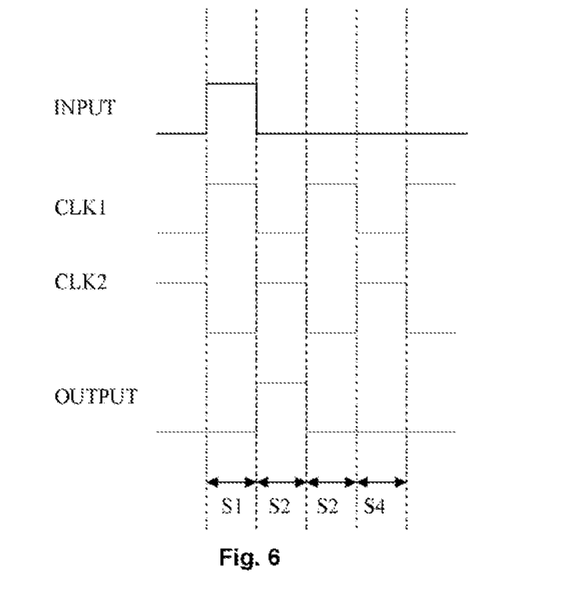
FIG. 6 is an operating timing diagram of the shift register corresponding to FIG. 5.

By taking, all the transistors T1 to T7 in the shift register according to the embodiment of the present disclosure being N-type thin film transistors as an example, FIG. 6 is an operating timing diagram of the shift register corresponding to FIG. 5. As shown in FIGS. 5 and 6, the shift register according to the embodiment of the present disclosure comprises seven transistor units (T1 to T7), two capacitors (C3 and C4), three signal input terminals (INPUT, CLK1 and CLK2), one signal output terminal (OUTPUT) and two power supply terminals (VH and VL).

Specifically, in a first phase S1 which is an input phase, signals at the signal input terminal INPUT and the first clock signal terminal CLK1 are at a high level, the first transistor T1 is turned on, and therefore a potential at the third node N3 is pulled up. In addition, since the signal at the first clock signal terminal CLK1 is at a high level, the third transistor T3 is turned on. At this time, although the second transistor T2 is also turned on and the signal at the first clock signal terminal CLK1 is at a high level, width-to-length ratios of channels of the second transistor T2 and the third transistor T3 may, for example, be set, so that a potential at the fourth node N4 may be closer to a low level at the second power supply terminal VL, to cause the fourth transistor T4 and the sixth transistor T6 to be turned off. Since the level at the third node N3 is a high level, the third capacitor C3 is charged and the fifth transistor T5 is turned on, but since an input signal at the second clock signal terminal CLK2 is a low-level signal, an output signal at the signal output terminal OUTPUT is at a low level.

In this phase, the signals at the signal input terminal INPUT and the first clock signal terminal CLK1 are both at a high level, the signal at the second clock signal terminal CLK2 is at a low level, and the output signal at the signal output terminal OUTPUT is at a low level.

In a second phase S2 which is an output phase, the signal at the first clock signal terminal CLK1 is at a low level, and the first transistor T1 and the third transistor T3 are turned off. Since the signal at the second clock signal terminal CLK2 changes from a low level to a high level, the potential at the third node N3 continues to be pulled up under the bootstrap effect of the third capacitor C3 at this time. Therefore, the second transistor T2 and the fifth transistor T5 remain in a turn-on state, the potential at the fourth node N4 remains at a low level under action of the low-level signal from the first clock signal terminal CLK1 through the second transistor T2, and therefore the fourth transistor T4 and the sixth transistor T6 are turned off. Since the signal at the second clock signal terminal CLK2 is at a high level, the output signal at the signal output terminal OUTPUT is pulled up by the input signal at the second clock signal terminal CLK2 to output a high-level signal, i.e., a gate driving signal for a current stage.

In this phase, the input signal at the second clock signal terminal CLK2 among the input terminals is at a high level, the input signals at the signal input terminal INPUT and the first clock signal terminal CLK1 are at a low level, and the output signal at the signal output terminal OUTPUT is at a high level.

In a third phase S3, the input signal at the first clock signal terminal CLK1 is at a high level, and therefore the first transistor T1 and the third transistor T3 are turned on. Since signals at the signal input terminal INPUT and the second power supply terminal VL are both low-level signals, the potentials at the third node N3 and the fourth node N4 are pulled down, the second transistor T2, the fourth transistor T4, the fifth transistor T5, and the sixth transistor T6 are turned off, and the output signal at the signal output terminal OUTPUT is released and reduced to a low level.

In a fourth phase S4, the input signal at the first clock signal terminal CLK1 is at a low level, and therefore the first transistor T1 and the third transistor T3 are turned off. Thus, the third node N3 and the fourth node N4 remain at a low level, and the input signal at the second dock signal terminal CLK2 is at a high level. Since the fourth node N4 remains at a low level, the sixth transistor T6 is turned off, the potential at the third node N3 may not be pulled up, and the output signal at the signal output terminal OUTPUT remains at a low level.

It should be illustrated that the third phase S3 and the fourth phase S4 continue for the shift register until the input signal at the signal input terminal INPUT becomes a high level again.

Figure 7:
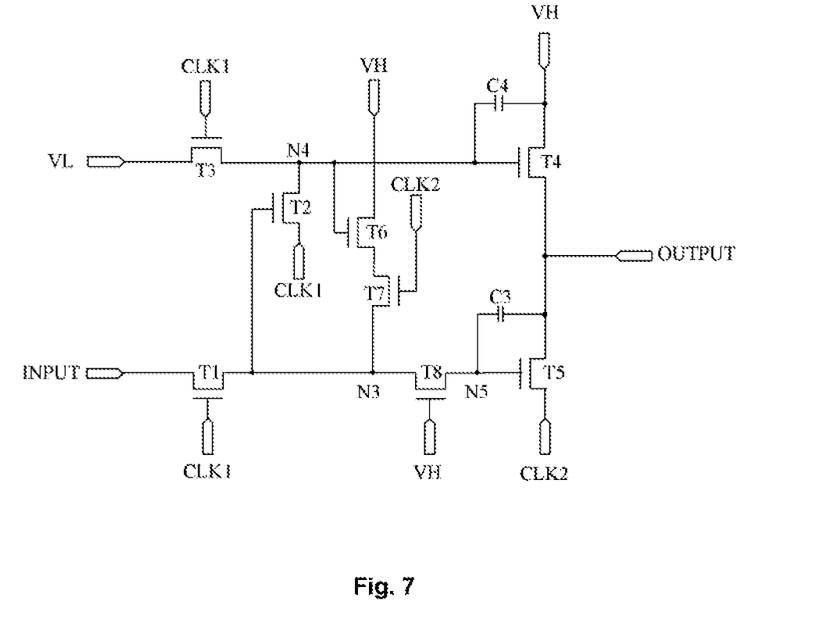
FIG. 7 is an equivalent circuit diagram of another shift register according to an embodiment of the present disclosure.

FIG. 7 is an equivalent circuit diagram of another shift register according to an embodiment of the present disclosure. As shown in FIG. 7, compared with FIG. 5, in the shift register of FIG. 7, an eighth transistor T8 is added between the third node N3 and the fifth transistor T5 and between the third node N3 and the third capacitor C3, and the eighth transistor T8 has a control electrode coupled to the first power supply terminal VH, a first electrode coupled to the third node N3, and a second electrode coupled to the control electrode of the fifth transistor T5. In addition, the third capacitor C3 has one terminal coupled to the second electrode of the eighth transistor T8, and the other terminal coupled to the signal output terminal OUTPUT.

In the present embodiment, the eighth transistor T8 is provided to perform voltage division, to avoid a voltage of a signal provided to the fifth transistor T5 from being too high, and increase an operating lifetime of the shift register.

Figure 8:
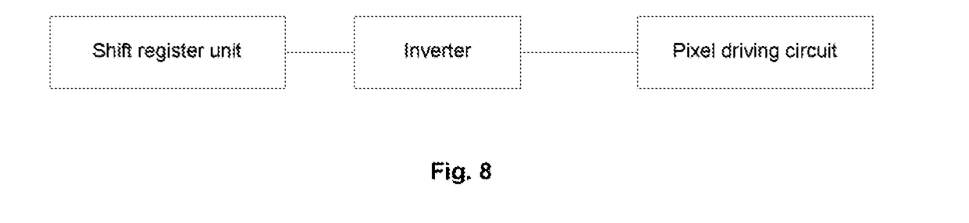
FIG. 8 is a schematic structural diagram of another pixel circuit according to an embodiment of the present disclosure.

As another implementation, FIG. 8 is a schematic structural diagram of another pixel circuit according to an embodiment of the present disclosure. When the transistors have a type opposite to that of the switching transistors, that is, the transistors are P-type transistors, as shown in FIG. 8, the pixel circuit further comprises an inverter coupled to the shift register and the pixel driving circuit respectively.

Specifically, the shift register is used to provide a first driving signal, the inverter is used to invert the first driving signal to generate a second driving signal, and the pixel driving circuit is used to control the light-emitting element according to the second driving signal.

Figure 9:
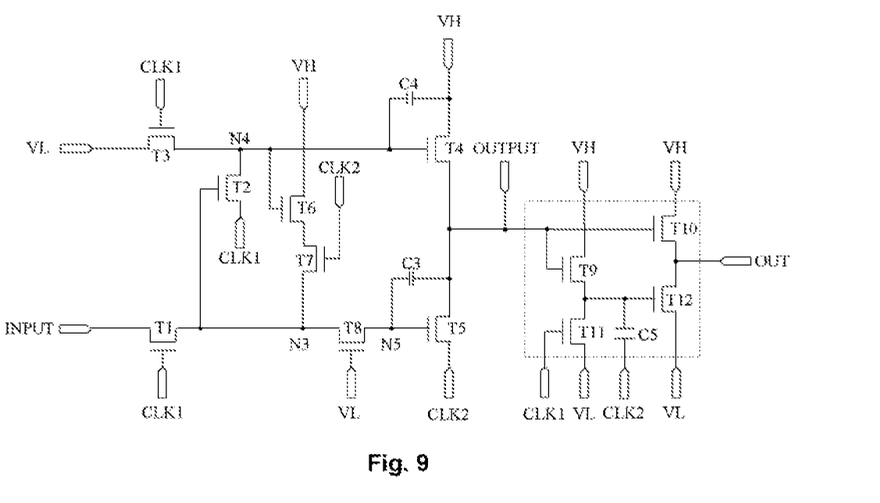
FIG. 9 is an equivalent circuit diagram of a shift register and an inverter according to an embodiment of the present disclosure.

In this implementation, FIG. 9 is an equivalent circuit diagram of a shift register and an inverter according to an embodiment of the present disclosure. Compared with the shift register provided in FIG. 7, in the shift register shown in FIG. 9, the control electrode of the eighth transistor T8 is coupled to a different signal terminal. In this implementation, the control electrode of the eighth transistor T8 is coupled to the second power supply terminal VL.

Figure 10:
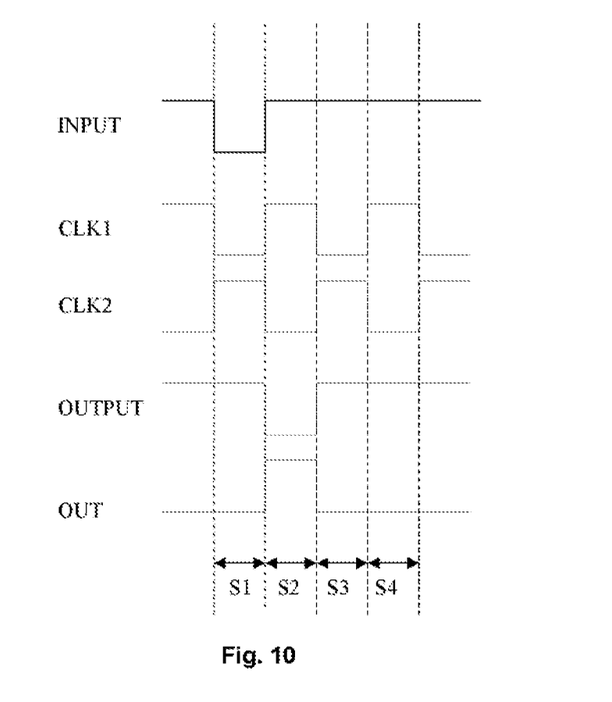
FIG. 10 is an operating timing diagram of the circuit corresponding to FIG. 9.

The transistors T1 to T8 in the shift register in FIG. 9 are all P-type transistors. FIG. 10 is an operating timing diagram of the circuit provided in FIG. 9. An operating principle of the circuit in FIG. 9 is similar to that of the shift register in FIG. 7, and will not be repeated here. It should be illustrated that an output signal at the signal output terminal of the shift register in FIG. 9 and the output signal at the signal output terminal of the shift register in FIG. 7 are mutually inverted signals.

In order to ensure that a scanning signal which is at a high level only in a certain phase may be input to the pixel driving circuit, in the embodiment of the present disclosure, an inverter is provided between the shift register and the pixel driving circuit. As shown in FIG. 8, the inverter comprises: a ninth transistor T9, a tenth transistor T10, an eleventh transistor T11, a twelfth transistor T12, and a fifth capacitor C5. Specifically, the ninth transistor T9 has a control electrode coupled to the signal output terminal OUTPUT, a first electrode coupled to the first power supply terminal VH, and a second electrode coupled to a first electrode of the eleventh transistor T11; the tenth transistor T10 has a control electrode coupled to the signal output terminal OUTPUT, a first electrode coupled to the first power supply terminal VH, and a second electrode coupled to an inversion output terminal OUT; the eleventh transistor T11 has a control electrode coupled to the first clock signal terminal CLK1, and a second electrode coupled to the second power supply terminal VL; the twelfth transistor T12 has a control electrode coupled to the second electrode of the ninth transistor T9, a first electrode coupled to the inversion output terminal OUT, and a second electrode coupled to the second power supply terminal VL; and the fifth capacitor C5 has one terminal coupled to the control electrode of the twelfth transistor T12, and the other terminal coupled to the second dock signal terminal CLK2.

The transistors in the inverter in the present embodiment are low-temperature polysilicon thin film transistors, and the transistors in the inverter have the same type as that of the transistors in the shift register.

Specifically, by taking the transistors in the inverter being P-type transistors as an example, an operating principle of the inverter is as follows.

In a first phase S1, an output signal at the signal output terminal OUTPUT is at a high level, and therefore the ninth transistor T9 and the tenth transistor T10 are turned off. An input signal at the first clock signal terminal CLK1 is a low-level signal, the eleventh transistor T11 is turned on, thereby the twelfth transistor T12 is turned on under action of a low-level signal from the second voltage terminal VL, and an output signal at the inversion output terminal OUT is the low-level signal from the second voltage terminal VL.

In a second phase S2, the output signal at the signal output terminal OUTPUT is at a low level, and therefore the ninth transistor T9 and the tenth transistor T10 are turned on. The input signal at the first clock signal terminal CLK1 is at a high level, and therefore the eleventh transistor T11 is turned off, thereby the twelfth transistor T12 is turned off under action of a high-level signal from the first power supply terminal VH through the ninth transistor T9, and the output signal at the inversion output terminal OUT is the high-level signal from the first power supply terminal VH through the tenth transistor T10.

The third phase S3 is the same as the first phase S1.

In a fourth phase S4, the output signal at the signal output terminal OUTPUT is at a high level, and therefore the ninth transistor T9 and the tenth transistor T10 are turned off. The input signal at the first clock signal terminal CLK1 is a high-level signal, and therefore the eleventh transistor T11 is turned off. At this time, an input signal at the second clock signal terminal CLK2 is a low-level signal. A difference between a level at the control electrode of the twelfth transistor T12 and the level at the second clock signal terminal CLK2 remains the same as that in a previous phase under the bootstrap effect of the fifth capacitor C5, and therefore the level at the control electrode of the twelfth transistor T12 also drops from a high-level signal to a low-level signal, so that the twelfth transistor T12 is turned on. The output signal at the inversion output terminal OUT is the low-level signal from the second voltage terminal VL, and the third phase and the fourth phase continue.

It should be illustrated that an exemplary structure of the inverter is specifically shown in FIG. 9. It is easily understood by those skilled in the art that the implementation of the inverter is not limited thereto, as long as functions thereof may be realized.

Specifically, in this implementation, the inversion output terminal OUT is coupled to the scanning signal terminal in the pixel driving circuit, and is used to provide a signal to the scanning signal terminal.

Based on the concepts of the embodiments disclosed above, the embodiments of the present disclosure further provide a display apparatus comprising the display panel according to the embodiments described above.

Figure 11:
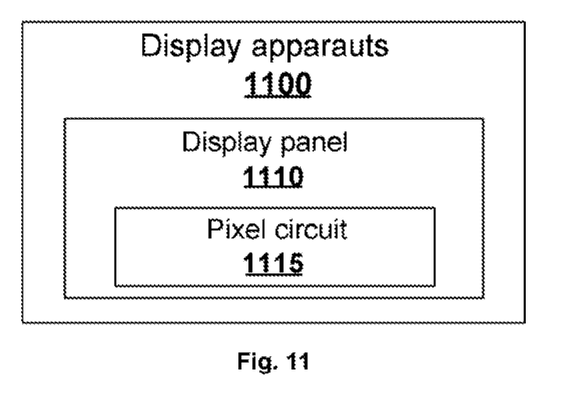
FIG. 11 is a schematic block diagram of a display apparatus according to an embodiment of the present disclosure.

FIG. 11 is a schematic block diagram of an exemplary display apparatus 1100 according to an embodiment of the present disclosure. As shown in FIG. 11, the display apparatus 1100 may comprise a display panel 1110, which may comprise a pixel circuit 1115. In some embodiments, the pixel circuit 1115 may be the pixel circuit as described above in connection with FIG. 4 or FIG. 8.

Here, the display panel comprises a display region and a non-display region. The pixel driving circuit in the pixel circuit is located in the display region of the display panel, and the shift register in the pixel circuit is located in the non-display region of the display panel.

In the embodiments of the present disclosure, all of the low-temperature polysilicon thin film transistors and the oxide thin film transistors are provided in the display panel, which may not only effectively reduce deviations of display grayscales of pixel electrodes in the display region and electrical energy consumption of the display apparatus during the display through the oxide thin film transistors, but also may be used to perform driving in a surrounding region using a good electrical performance and stability of the low-temperature polysilicon thin film transistors. Thereby, it may effectively improve performance of products and enhance competitiveness of the products.

Specifically, the display panel according to the embodiment of the present disclosure comprises the pixel circuit according to the embodiments described above, and has implementation principles and implementation effects which are similar to those of the pixel circuit according to the embodiments described above, which will not be repeated here.

Based on the concepts of the embodiments disclosed above, the embodiments of the present disclosure further provide a display apparatus comprising the display panel according to the embodiments described above.

Here, the implementation principles and implementation effects of the display apparatus according to the embodiments of the present disclosure are similar to those of the display panel, and will not be repeated here.

In some embodiments, the display apparatus may be any product or component having a display function such as a liquid crystal display panel, an electronic paper, a mobile phone, a tablet computer, a television, a display, a notebook computer, a digital photo frame, a navigator etc.

The accompanying drawings of the embodiments of the present disclosure relate only to the structures involved in the embodiments of the present disclosure, and other structures may be known with reference to general design.

For clarity, in the accompanying drawings used to describe the embodiments of the present disclosure, thicknesses and sizes of layers or microstructures are exaggerated. It may be understood that when an element such as a layer, a film, a region, or a substrate etc. is referred to as being "on" or "below" another element, it may be "directly on" or "directly below" the other element, or there may be an intermediate element therebetween.

The embodiments of the present disclosure, i.e., features in the embodiments, may be combined with each other to obtain a new embodiment without a conflict.

Although the implementations disclosed in the present disclosure are as described above, the contents described are only the implementations used for easily understanding the present disclosure, and are not intended to limit the present disclosure. Any skilled in the art to which the present disclosure belongs may make any modifications and changes in forms and details of the implementations without departing from the spirit and the scope disclosed in the present disclosure, but the patent protection scope of the present disclosure still needs to be defined by the scope of the appended claims.

We claim:

1. A pixel circuit, comprising:
   a shift register comprising a plurality of transistors, wherein each of the transistors is a low temperature polysilicon thin film transistor; and
   a pixel driving circuit for driving a light-emitting element to emit light,
   wherein the pixel driving circuit includes a plurality of switching transistors, the transistors have a type opposite to that of the switching transistors, the pixel circuit further comprises:
   an inverter coupled to the shift register and the pixel driving circuit respectively,
   wherein the shift register is configured to provide a first driving signal, the inverter is configured to invert the first driving signal to generate a second driving signal, and the pixel driving circuit is configured to control the light-emitting element according to the second driving signal, and
   wherein the inverter comprises:
      a ninth transistor having a control electrode coupled to a signal output terminal, a first electrode coupled to a first power supply terminal, and a second electrode coupled to a first electrode of an eleventh transistor;
      a tenth transistor having a control electrode coupled to the signal output terminal, a first electrode coupled to the first power supply terminal, and a second electrode coupled to an inversion output terminal;

the eleventh transistor having a control electrode coupled to a first clock signal terminal, and a second electrode coupled to a second power supply terminal;

a twelfth transistor having a control electrode coupled to the second electrode of the ninth transistor, a first electrode coupled to the inversion output terminal, and a second electrode coupled to the second power supply terminal; and a fifth capacitor having one terminal coupled to the control electrode of the twelfth transistor and the other terminal coupled to a second clock signal terminal.

2. The pixel circuit according to claim 1, wherein all the transistors are of the same type.

3. The pixel circuit according to claim 2, wherein when the transistors have the same type as that of the switching transistors, the shift register is configured to provide a first driving signal, and the pixel driving circuit is configured to control the light-emitting element according to the first driving signal.

4. The pixel circuit according to claim 1, wherein transistors in the inverter have the same type as that of the transistors in the shift register.

5. The pixel circuit according to claim 1, wherein the plurality of transistors in the shift register comprise:

a first transistor having a control electrode coupled to a first clock signal terminal, a first electrode coupled to a signal input terminal, and a second electrode coupled to a third iiode a second transistor having a control electrode coupled to the third node, a first electrode coupled to the first clock signal terminal, and a second electrode coupled to a fourth node;

a third transistor having a control electrode coupled to the first clock signal terminal, a first electrode coupled to a second power supply terminal, and a second electrode coupled to the fourth node;

a fourth transistor having a control electrode coupled to the fourth node, a first electrode coupled to a first power supply terminal, and a second electrode coupled to a signal output terminal;

a fifth transistor having a control electrode coupled to the third node, a first electrode coupled to the signal output terminal, and a second electrode coupled to a second clock signal terminal;

a sixth transistor having a control electrode coupled to the fourth node, a first electrode coupled to the first power supply terminal, and a second electrode coupled to a first electrode of a seventh transistor; and the seventh transistor having a control electrode coupled to the second clock signal terminal, and a second electrode coupled to the third node.

6. The pixel circuit according to claim 5, further comprising:

a third capacitor having one terminal coupled to the third node and the other terminal coupled to the signal output terminal; and a fourth capacitor having one terminal coupled to the fourth node and the other terminal coupled to the first power supply terminal.

7. The pixel circuit according to claim 1, wherein the plurality of transistors in the shift register comprise:

a first transistor having a control electrode coupled to a first clock signal terminal, a first electrode coupled to a signal input terminal, and a second electrode coupled to a third node;

a second transistor having a control electrode coupled to the third node, a first electrode coupled to a first clock signal terminal, and a second electrode coupled to a fourth node;

a third transistor having a control electrode coupled to the first clock signal terminal, a first electrode coupled to a second power supply terminal, and a second electrode coupled to the fourth node;

a fourth transistor having a control electrode coupled to the fourth node, a first electrode coupled to a first power supply terminal, and a second electrode coupled to a signal output terminal;

a fifth transistor having a control electrode coupled to a second electrode of an eighth transistor, a first electrode coupled to the signal output terminal, and a second electrode coupled to a second clock signal terminal;

a sixth transistor having a control electrode coupled to the fourth node, a first electrode coupled to the first power supply terminal, and a second electrode coupled to a first electrode of a seventh transistor;

the seventh transistor having a control electrode coupled to the second clock signal terminal, and a second electrode coupled to the third node; and the eighth transistor having a control electrode coupled to the first power supply terminal and a first electrode coupled to the third node.

8. The pixel circuit according to claim 7, further comprising:

a third capacitor having one terminal coupled to the second electrode of the eighth transistor and the other terminal coupled to the signal output terminal; and a fourth capacitor having one terminal coupled to the fourth node and the other terminal coupled to the first power supply terminal.

9. A display panel, comprising: the pixel circuit according to claim 1.

10. A display apparatus comprising the display panel according to claim 9.

11. The pixel driving circuit according to claim 1, comprising:

a plurality of switching transistors comprising:

a first switching transistor having a control electrode coupled to a scanning signal terminal, a first electrode coupled to a data signal terminal, and a second electrode coupled to a first node;

a second switching transistor having a control electrode coupled to a reset signal terminal, a first electrode coupled to a signal input terminal, and a second electrode coupled to a second node; and a third switching transistor having a control electrode coupled to a light-emitting control terminal, a first electrode coupled to a high-level power supply terminal, and a second electrode coupled to a first electrode of a driving transistor, the driving transistor having a control electrode coupled to the first node and a second electrode coupled to the second node;

a first capacitor having one terminal coupled to the first node and the other terminal coupled to the second node; and a second capacitor having one terminal coupled to the high-level power supply terminal and the other terminal coupled to the second node, wherein each of the switching transistors is an oxide thin film transistor, wherein the driving transistor is a low temperature polysilicon thin film transistor.

12. The pixel driving circuit according to claim 11, wherein all the switching transistors are N-type transistors or all the switching transistors are P-type transistors.

\* \* \* \* \*